United States Patent
Salvi et al.

(10) Patent No.: US 6,864,817 B1
(45) Date of Patent: Mar. 8, 2005

(54) SIGNALING DEPENDENT ADAPTIVE ANALOG-TO-DIGITAL CONVERTER (ADC) SYSTEM AND METHOD OF USING SAME

(75) Inventors: Raul Salvi, Boca Raton, FL (US); John J. Parkes, Jr., Boynton Beach, FL (US); James J. Riches, Lake Worth, FL (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/748,543

(22) Filed: Dec. 30, 2003

(51) Int. Cl.[7] .................... H03M 1/12; H04B 1/06
(52) U.S. Cl. ........................... 341/139; 455/234.1
(58) Field of Search .................... 341/139, 143; 455/234.1, 234.2, 235.1, 236.1

(56) References Cited

U.S. PATENT DOCUMENTS

| | | | |
|---|---|---|---|
| 6,127,955 A | 10/2000 | Handel et al. | |
| 6,445,317 B2 | 9/2002 | Lundin et al. | |
| 6,670,901 B2 * | 12/2003 | Brueske et al. | 341/139 |
| 6,680,682 B2 * | 1/2004 | Arnaud et al. | 341/155 |
| 2002/0177421 A1 * | 11/2002 | Muhammad et al. | 455/131 |
| 2003/0078007 A1 * | 4/2003 | Parssinen et al. | 455/67.1 |
| 2003/0207674 A1 * | 11/2003 | Hughes | 455/234.1 |
| 2004/0142670 A1 * | 7/2004 | Ciccarelli | 455/214 |

* cited by examiner

*Primary Examiner*—Howard L. Williams
(74) *Attorney, Agent, or Firm*—Miller, Johnson, Snell & Cummiskey, P.L.C.

(57) ABSTRACT

An adaptive analog-to-digital converter (ADC) system (100) includes an automatic gain control (AGC) controller (101) for receiving both in-band and out-of-band signals from a radio frequency (RF) receiver and producing an AGC control signal therefrom. A digital signal processor (DSP) (103) is then used for interpreting the AGC control signal and providing an adjustment signal to an ADC (105). The ADC (105) uses the adjustment signal to dynamically control efficiency of the ADC system 100 by adjusting bit resolution, reference capacitance and bias based upon the RF signal received and desired protocol requirements presented to the AGC controller (101).

24 Claims, 3 Drawing Sheets

SIGNALING DEPENDENT ADAPTIVE ANALOG-TO-DIGITAL CONVERTER (ADC) SYSTEM AND METHOD OF USING SAME

TECHNICAL FIELD

This invention relates in general to an analog-to-digital converter (ADC) and more specifically to an ADC that is capable of adaptively modifying its dynamic range and power requirements based on input signal conditions.

BACKGROUND

The use of analog-to-digital converter technology is well known and widely used to convert information such as voice and data from an analog domain to a digital one. As is well known in the art, signal information can more easily be processed, transmitted and manipulated much more effectively once analog signals have been converted into the digital domain.

Past ADC designs were constructed such that the ADC continually attempted to handle worst case signal conditions no matter what type of signal was received. Even when receiving a strong signal with low signal-to-noise requirements, the ADC continually worked the incoming signal as if it were a degraded signal. Those skilled in the art will further recognize that an ADC's input signal dynamic range is purposely made large order to handle a broad spectrum of signal and noise inputs. Thus the ADC is over designed for certain signal conditions and protocol requirements. This "over design" result in both a greater degree of circuit design area and an excessive current drain on a portable device.

In many instances, the device is not receiving signals under worst case signaling conditions but,nonetheless, is required to operate in this manner in this low efficiency mode due to required specifications. Thus, in order to obtain the lowest noise figure and best matching in the ADC, the ADC is designed for worst case signaling conditions. Ultimately, this approach becomes costly since the ADC cannot be dynamically changed based on input signal conditions.

Thus, the need exists to provide an adaptive ADC that can dynamically control its dynamic range enabling current drain and mathematical requirements to be varied in order to best accommodate the instantaneous RF signaling environment. This would enable the ADC to conserve power under optimal signal conditions yet alter dynamic range when those conditions cross some predetermined threshold.

SUMMARY OF THE INVENTION

Briefly, according to the invention, there is provided a system and method for operating an analog-to-digital converter (ADC) circuit topology which works to adaptively modify the dynamic range of the ADC based upon received signal conditions and associated noise performance specifications. These adjustments allow the ADC to continually adjust its operational parameters while maximizing its efficiency with regard to current drain.

The preferred method of the invention typically uses a combination of analog and digital techniques controlled by a digital signal processor (DSP) that monitors signal conditions at the input of an antenna as well as both the input and output of the ADC. The operational parameters controlled by the DSP include allowing a reference capacitance of the various ADC stages to be dynamically varied where optimal settings can be reached between current drain and thermal noise. Since higher capacitance equates to higher current drain to maintain the slew rate, and lower noise, this tradeoff can be very useful since the ADC can be dynamically adjusted based on varying signaling requirements.

Further, the DSP evaluates received input signal requirements as compared with predetermined signal-to-noise ratios for a given modulation scheme. The DSP can then vary the resolution of the digital quantization processes enabling the clock rate and a number of digital output bits in a quantizer to be varied to achieve a lower current drain. Thus, the quantization noise floor, as compared with the number of digital logic circuits drawing current in the ADC, can be varied to produce the desired signal-to-noise ratio (SNR) in any type of radio frequency (RF) receiver application. This has the ultimate effect of increasing the battery life of a portable device using the invention allowing it to be operated for longer periods with no change in receiver performance.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
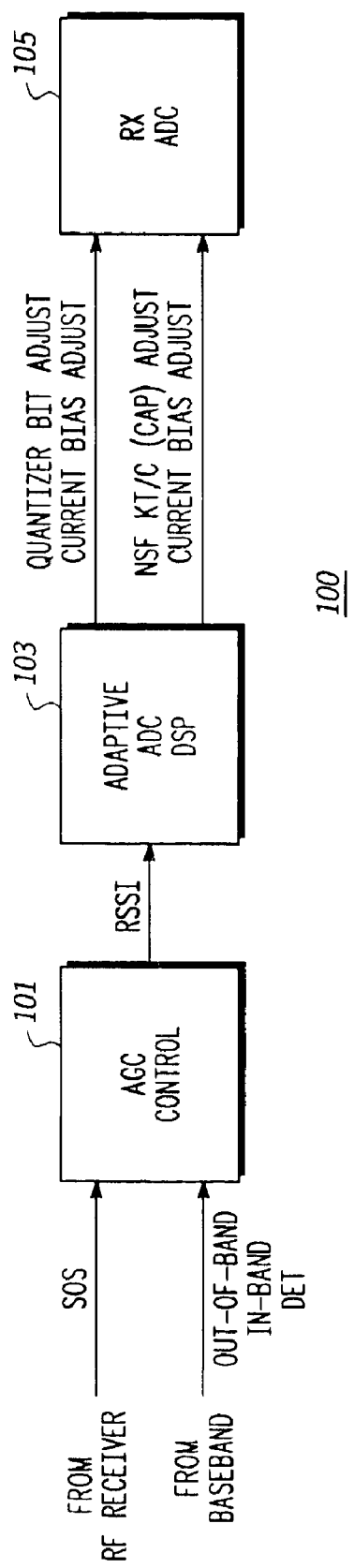
FIG. 1 is a block diagram showing the location of an adaptive analog-to-digital converter (ADC) as used in a radio frequency (RF) receiver according to the preferred embodiment of the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a system level block diagram illustrates the system and method that incorporates a signaling dependent adaptive analog-to-digital converter (ADC) 100. The invention includes an automatic gain controller 101 that uses both sum-of-squares (SOS) measurement from a radio frequency (RF) receiver as well as both in-band and out-of-band noise detection from baseband. As well known in the art, the digital input signal may be broken into in-phase (I) and out-of-phase (Q) components. A sum-of-squares calculation can be used to calculate a number representing total power received. As is well known in the art, the I and Q components are mathematically squared and summed such that the alternating current (AC) voltage magnitude of the I and Q components can produce a direct current (DC) voltage. This resultant DC voltage, as well as in-band and out-of-band interference, is detected and used by the AGC controller 101 to produce a radio signal strength indication (RSSI) signal. Thus, the RSSI signal is an absolute measurement of signal-to-noise quality based not only on the signal strength of the received signal but also any on-channel or off-channel interfering signals that work to degrade performance of the RF receiver (not shown).

The invention then provides an adaptive ADC digital signal processor (DSP) 103 that is used to adjust at least four (4) ADC control parameters. These control parameters can then be used to manipulate various functions of the receiver ADC 105 enabling it to maximize performance for only a minimal amount of current drain. The parameters include adjustment of the number of quantizer bits used by the ADC, adjustment of bias current used by the ADC bit comparators, adjustment of the size of reference capacitors used in the ADC to control noise and an adjustment of the bias current used for charging the reference capacitors within the ADC 105. The reference capacitance may be either a switching, filtering or integration capacitance depending on the desired application.

As also known in the art, the reference capacitors in the ADC are typically used to mimic a resistance used within the circuit to control functional aspects of the ADC. In one application, the invention allows a switching capacitance or integration capacitance used within an operational amplifier within the ADC to be precisely controlled. This allows any thermal noise created by the operational amplifier to be kept to a minimum. In another application, a shaping filter used in connection with the ADC can be varied whereby a coupling capacitance used as part of a resister capacitor (RC) time constant is controlled. The invention enables both the bandwidth and noise response of the shaping filter to be dynamically tuned, depending upon incoming signal quality and a particular set of digital protocol requirements.

Thus, the adaptive ADC DSP 103 uses the digital protocol multiple access requirements (MA), the input signal power level, and the received in-band and out-of-band noise to set these four ADC control parameters so that receive requirements are met while using only the minimal amount of current in order to perform these operations. Since the dynamic range of the ADC 105 can be controlled so precisely, it enables the devices to use only a minimal amount of current-preserving battery life in any type of portable device such as a two-way radio, cellular telephone or computer using this type of ADC.

Thus, in a typical scenario for the adaptive ADC DSP, if the SOS from the RF receiver matches the in-band signal within a predetermined limit, then the signal being received by the RF receiver is a "desired" RF input signal. However, if the SOS signal is significantly larger, i.e., a greater magnitude than the in-band signal, this means that there are other in-band or out-of-band signals that are also being received with the desired RF input signal. Consequently, an adaptive signal measurement is included with the RSSI signal to the adaptive ADC DSP 103. This adaptive signal measure is translated into a set of commands, i.e., adjusted by the four ADC control parameters for use by the ADC 105 on how to set itself for optimal performance based on present receive conditions.

Figure 2:
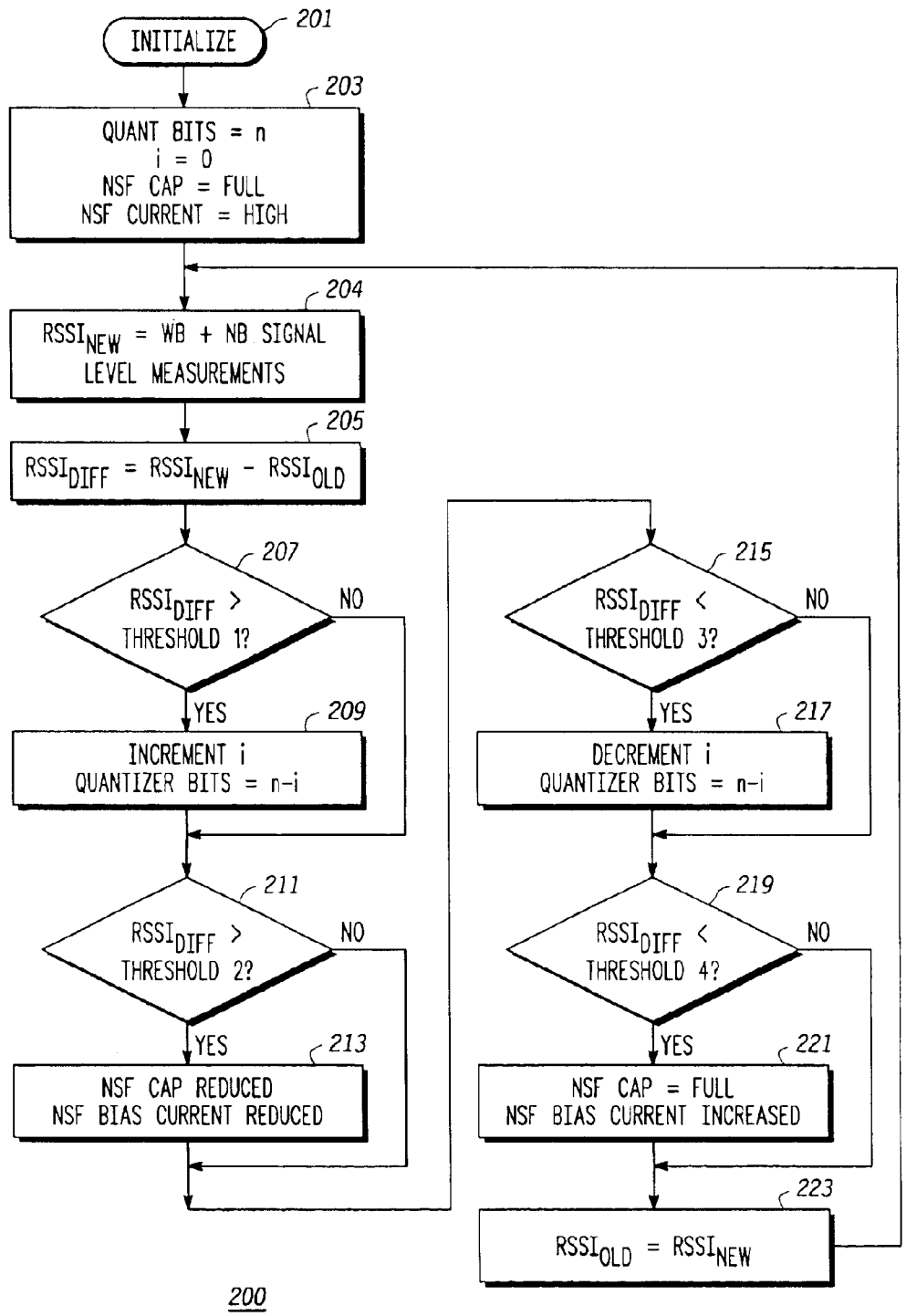
FIG. 2 is a flow chart diagram of the adaptive ADC and the operation of its digital signal processing according to the preferred method of the invention.

FIG. 2 is a flow chart diagram of the preferred method 200 used by the adaptive ADC DSP 103 in its selection of control parameters used by the ADC 105. Initially, the ADC 105 is initialized 201 where the ADC 105 is adjusted 203 to establish a set of predetermined values. These adjustments include setting the number of quantization bits used by ADC 105 to its highest resolution (n), setting the noise-shaping filter current to maximum value and setting the value of the capacitors to maximum which are used to adjust thermal noise to its minimum value. As is well known in the art, this type of thermal noise, also known as spectral power density (Watts/Hz), is calculated as KT/C where K is Boltmans constant, T is temperature in Kelvin and C is the reference switching capacitance in farads.

A new RSSI measurement is then generated ($RSSI_{new}$) by adding 204 a wideband (WB) off-channel measurement with a narrow band (NB) on-channel measurement. $RSSI_{new}$ is then used with a stored value of the RSSI measurement ($RSSI_{old}$) where $RSSI_{old}$ is subtracted 205 from $RSSI_{new}$ to determine $RSSI_{diff}$. $RSSI_{diff}$ is used to determine 207 if a first predetermined threshold has been reached. If the first predetermined threshold has been reached, then the number of quantization bits used by the ADC can be decremented 209. If the threshold has not been reached, $RSSI_{diff}$ is again used to determine if a second predetermined threshold has been reached 211. If the second threshold has been reached, then the value of the charging capacitors used within the ADC is reduced 213 as well as the bias current used to charge the capacitors. If the second predetermined threshold has not been reached, then $RSSI_{diff}$ is again used to determine 215 if it is less than a third predetermined threshold. If the third predetermined threshold has been reached, then the number of bits used in the quantization process, i.e., the resolution of the analog-to-digital conversion is reduced 217. If the third threshold has not been reached, then $RSSI_{diff}$ is again used to determine if that measurement is less than a fourth predetermined threshold 219. If the measurement is less than the fourth predetermined threshold, the capacitors used in the ADC are increased to their full capacity and the bias current used to charge the capacitors is increased to a maximum level 221. However, if the measurement does not meet the fourth predetermined threshold, $RSSI_{old}$ is set to a value equal to the $RSSI_{new}$ measurement and the process loops back 223 to the new $RSSI_{new}$ calculation 204 where the process is repeated. As will be evident to those skilled in the art, this is only one embodiment of the algorithm used in connection with the present invention. Any iterations or additional steps where control parameters or a greater or lesser amount of components are possible.

Figure 3:
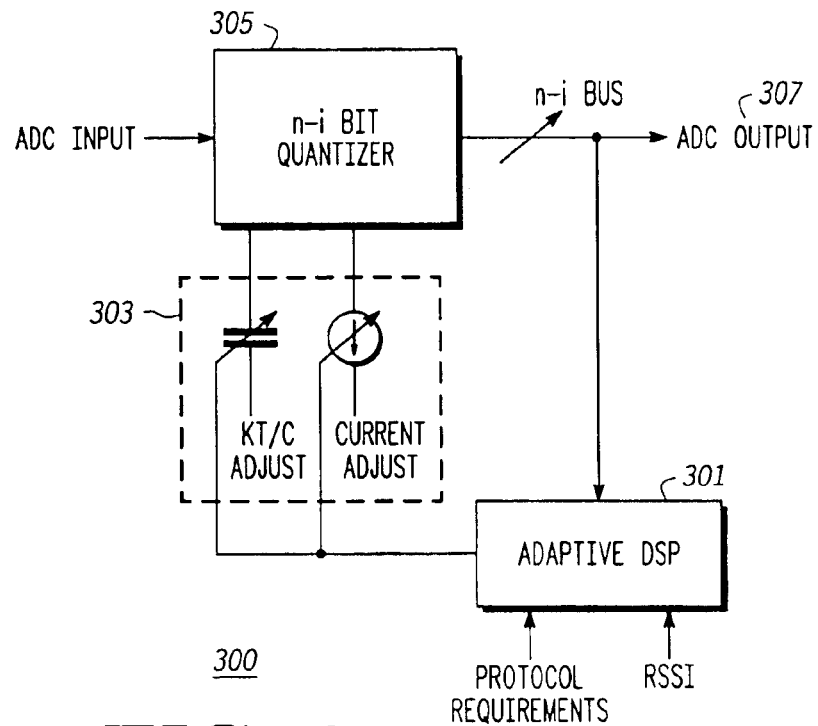
FIG. 3 is block diagram showing operation of an adaptive Nyquist sampled ADC according to the preferred embodiment of the invention.

FIG. 3 is a block diagram of an adaptive Nyquist sampled ADC 300 shown by the receiver ADC 105 in FIG. 1. As is well known in the art, the Nyquist sampled ADC provides a means to adjust a control network 303 using adaptive DSP 301. As discussed herein, an adaptive RSSI measurement, ADC output and specified protocol requirements control an adaptive DSP 301 which in turn controls an adjustable capacitance and current adjustment in the control network 303. This is used to adjust an n-i bit quantizer 305 that receives an ADC analog input signal where (n) is the maximum number of bits and (i) is the integer bit reducer based upon S/N ratio and RSSI input. As known in the art, the n-i bit quantizer 305 operates at a standard Nyquist sampled rate (2×fastest input signal frequency) to convert the analog input signal to n-i bits which are output to an ADC output 307.

Figure 4:
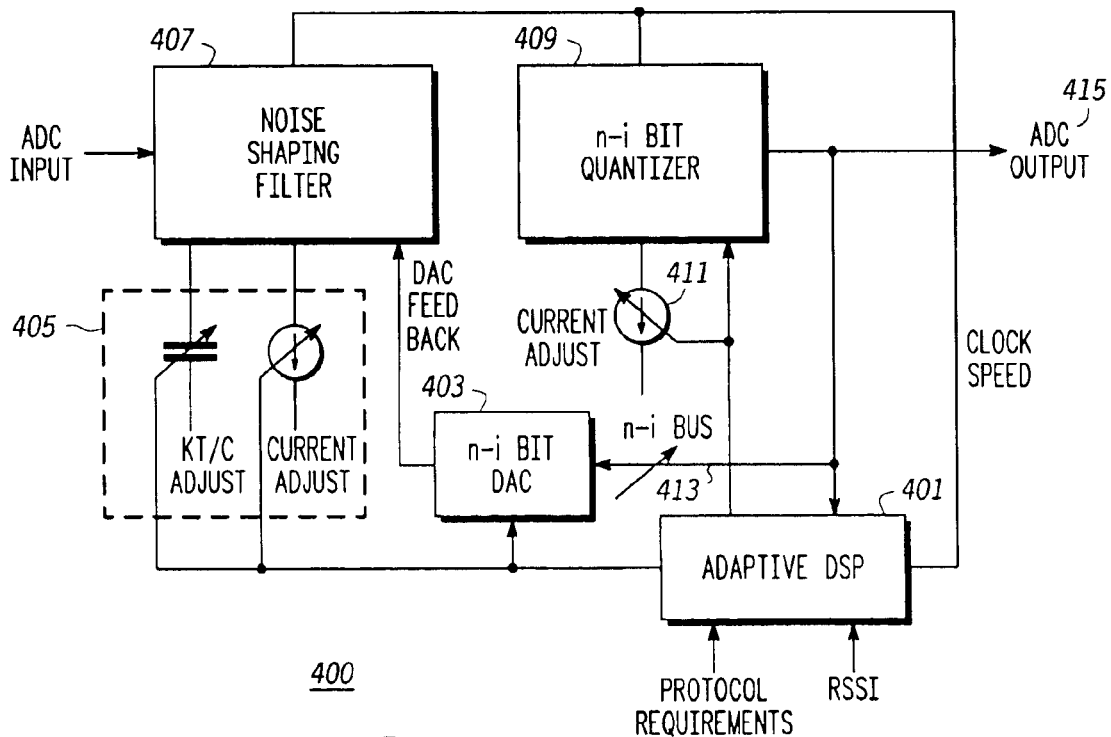
FIG. 4 is a block diagram showing operation of an adaptive over sampled ADC according to an alternative embodiment of the invention.

Similarly, FIG. 4 is a block diagram of an adaptive over-sampled ADC 400 which can be used with the present invention which samples an analog input at a rate faster than the typical Nyquist rate (greater than 2×fastest input signal frequency). The ADC 400 includes an adaptive DSP 401 that works to control an n-i bit DAC 403, control network 405 and a current adjustment 411 for the n-i bit quantizer 409. The DSP 401 utilizes both an RSSI input, protocol requirements input and ADC input for the n-i bit DAC 403 and a control network 405. A noise shaping filter 407 which is controlled by the control network 405, receives an ADC analog input and the n-i bit digital-to-analog converter (DAC) feedback. The control network 405 is comprised of a variable capacitance for controlling thermal noise (KT/C) generated by the noise shaping filter 407 as well as a bias adjustment which works to charge any switching, integration or coupling capacitance therein. The clock speed of the noise shaping filter 407 is controlled by the adaptive DSP 401. The noise shaping filter has a predetermined frequency response and is used to control noise and spurious signals arriving over the analog ADC input and/or generated by the over sampled system used to eliminate quantization noise. An n-i bit quantizer 409 converts the shaped analog input signal to a digital representation. The DSP 401 includes the capability to control the over-sampled clock speed of the n-i bit quantizer 409 which enables the DSP to efficiently control current drain. The output of n-i bit quantizer 409 is then provided to both an ADC output 415 and to an n-i bus 413 which acts to provide loop feedback to the n-i bit DAC 403. The topology of ADC 400 is advantageous since it may use sigma-delta type technology to achieve efficient analog-to-digital performance using less current and overall integration area.

Thus, the present invention uses both an AGC controller as well as an adaptive ADC DSP to control various operational parameters of an ADC located in an RF receiver. These parameters include adjusting the quantizer bit resolution as well as the bias used by the quantizer circuitry. Moreover, the capacity of reference capacitors in the ADC can be adjusted in addition to their charging bias in order to control the total capacity and charging rate of these capacitors. Varying these parameters ultimately allows for complete control of the ADC allowing it to draw the least amount of current while still providing optimal ADC performance based upon given input signal conditions.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An adaptive analog-to-digital converter (ADC) system comprising:
   an automatic gain control (AGC) controller for receiving both in-band and out-of-band signals from a radio frequency (RF) receiver and producing an AGC control signal therefrom;
   a digital signal processor (DSP) for interpreting the AGC control signal and providing at least one adjustment signal to an ADC; and
   wherein the ADC uses the at least one adjustment signal to control current drain based upon an RF signal received by the AGC controller.

2. An adaptive ADC system as in claim 1, wherein the AGC controller receives an on-channel signal and an in-band detection signal for determining the amount of on-channel interference received by the RF receiver.

3. An adaptive ADC system as in claim 2, wherein the AGC controller processes an RF signal input and a baseband signal input for producing at least one radio signal strength indication (RSSI) signal used as the ADC control signal.

4. An adaptive ADC system as in claim 1, wherein the at least one adjustment signal adjusts quantizer bit resolution.

5. An adaptive ADC system as in claim 1, wherein the at least one adjustment signal controls current bias used by a bit quantizer in the ADC.

6. An adaptive ADC system as in claim 1, wherein the at least one adjustment signal adjusts the current bias used by a reference capacitance in the ADC.

7. An adaptive ADC system as in claim 1, wherein the at least one adjustment signal adjusts over-sampled clock speed in the ADC.

8. An adaptive analog-to-digital converter (ADC) system that utilizes digital signal processing to control operational parameters of an ADC comprising:
   an automatic gain control (AGC) controller for receiving at least one input signal from a radio frequency (RF) receiver and providing an AGC control signal in response thereto;
   a digital signal processor (DSP) for receiving the AGC control signal and providing at least one adaptive ADC control signal based on desired communication protocol requirements; and
   an ADC for converting received analog input signals to a digital format and dynamically controlling current drain based upon the at least one adaptive control signal.

9. An adaptive ADC system as in claim 8, wherein the AGC controller receives both a sum-of-squares (SOS) signal from an RF receiver and an in-band signal for determining the quality of a received RF input signal.

10. An adaptive ADC system as in claim 8, wherein the AGC controller receives an input to the ADC, an output from the ADC and the at least one input signal.

11. An adaptive ADC system as in claim 10, wherein the AGC controller produces a received signal strength indication (RSSI) control signal based upon the SOS signal and the in-band signal.

12. An adaptive ADC system as in claim 11, wherein the RSSI signal is provided to the DSP for dynamically controlling the at least one adaptive control signal.

13. An adaptive ADC system as in claim 8, wherein the at least one adaptive ADC control signal controls the number of bits used by an ADC quantizer.

14. An adaptive ADC system as in claim 8, wherein the at least one adaptive ADC control signal controls the amount of current used by an ADC quantizer.

15. An adaptive ADC system as in claim 8, wherein the at least one adaptive ADC control signal controls the amount of charging current used by a reference capacitance in the ADC.

16. An adaptive ADC system as in claim 8, wherein the at least one adaptive ADC control signal controls clock speed of the ADC.

17. A method for adjusting the operational parameters of an analog-to-digital converter (ADC) for providing optimal performance with minimum current drain comprising the steps of:
   receiving a radio frequency (RF) input signal from a receiver;
   producing at least one automatic gain control (AGC) signal from the received RF input signal;
   processing the AGC (control) signal using a digital signal processor to provide at least one adjustment control signal; and
   receiving the at least one adjustment control signal at an ADC where the at least one adjustment control signal is used to control functionality of the ADC to maximize efficiency based upon the received RF input signal.

18. A method for adjusting the operational parameters of an ADC as in claim 17, further comprising the step of:

utilizing a sum-of-squares signal calculation and an in-band signal to produce the at least one AGC signal.

19. A method for adjusting the operational parameters of an ADC as in claim 18, wherein the at least one AGC signal is a radio signal strength indication (RSSI) signal.

20. A method for adjusting the operational parameters of an ADC as in claim 17, wherein the AGC signal is processed based on desired communications protocol requirements.

21. A method for adjusting the operational parameters of an ADC as in claim 17, wherein the at least one adjustment control signal controls quantizer bit resolution in the ADC.

22. A method for adjusting the operational parameters of an ADC as in claim 17, wherein the at least one adjustment control signal controls bias current used by a quantizer in the ADC.

23. A method for adjusting the operational parameters of an ADC as in claim 17, wherein the at least one adjustment control signal controls the amount of charging bias used by a reference capacitance in the ADC.

24. A method for adjusting the operational parameters of an ADC as in claim 17, wherein the at least one adjustment control signal controls the reference clock speed of the ADC.

* * * * *

UNITED STATES PATENT AND TRADEMARK OFFICE
CERTIFICATE OF CORRECTION

PATENT NO. : 6,864,817 B1  
APPLICATION NO. : 10/748543  
DATED : December 30, 2003  
INVENTOR(S) : Raul Salvi It is certified that error appears in the above-identified patent and that said Letters Patent is hereby corrected as shown below:

In Column 6, Line 60, Claim No. 17:

Change "AGC (control) signal" to --AGC signal--

Signed and Sealed this

Sixth Day of May, 2008

JON W. DUDAS  
*Director of the United States Patent and Trademark Office*

UNITED STATES PATENT AND TRADEMARK OFFICE
CERTIFICATE OF CORRECTION

PATENT NO. : 6,864,817 B1  Page 1 of 1
APPLICATION NO. : 10/748543
DATED : March 8, 2005
INVENTOR(S) : Raul Salvi It is certified that error appears in the above-identified patent and that said Letters Patent is hereby corrected as shown below:

In Column 6, Line 60, Claim No. 17:

Change "AGC (control) signal" to --AGC signal--

This certificate supersedes the Certificate of Correction issued May 6, 2008.

Signed and Sealed this

Third Day of June, 2008

JON W. DUDAS
*Director of the United States Patent and Trademark Office*